United States Patent [19]

Bremer et al.

[11] 4,095,179

[45] June 13, 1978

[54] LOCATING SYSTEM TO DETERMINE THE POSITION OF MOVABLE BODIES WITH RESPECT TO A REFERENCE

[75] Inventors: Wolfgang Bremer, Oberweier; Frieder Heintz, Blankenloch-Büchig; Ulrich Flaig, Markgröningen; Uwe Kiencke, Ludwigsburg; Wolfram Glauert, Bamberg, all of Germany

[73] Assignee: Robert Bosch GmbH, Stuttgart, Germany

[21] Appl. No.: 604,228

[22] Filed: Aug. 13, 1975

[30] Foreign Application Priority Data

Aug. 29, 1974 Germany .............................. 2441437
Sept. 27, 1974 Germany .............................. 2446193

[51] Int. Cl.² .......................................... G01R 33/12
[52] U.S. Cl. .................................. 324/207; 324/16 T; 324/174; 310/111; 123/117 D
[58] Field of Search .................... 324/15, 16 R, 16 T, 324/34 PS, 34 D, 34 R, 167, 174, 178, 179; 310/111, 152; 340/347 P; 123/117 R, 117 D

[56] References Cited

U.S. PATENT DOCUMENTS

| 3,230,407 | 1/1966 | Marsh, Jr. ............................ 310/111 |
| 3,548,300 | 12/1970 | Nolting .............................. 324/16 T |
| 3,562,741 | 2/1971 | McEvoy et al. ...................... 310/111 |
| 3,883,795 | 5/1975 | Klein et al. ......................... 324/16 T |

FOREIGN PATENT DOCUMENTS

1,303,993  1/1973  United Kingdom .............. 324/34 D

*Primary Examiner*—Robert J. Corcoran
*Attorney, Agent, or Firm*—Flynn & Frishauf

[57] ABSTRACT

The movable body is supplied with at least two marker elements to move therewith, the reference being at a fixed location at which a stationary transducer is located responsive to the marker elements and to provide output signals staggered in time as the marker elements pass by the transducer, so that the marker elements in combination with the transducer form a pulse source. The individual marker elements are different to provide pulses having respectively different characteristics, which pulses are conducted to threshold stages which, in turn, are connected to a logic circuit to evaluate and logically combine the respectively different pulses from the pulse source. Different pairs of marker elements, for example associated with different pistons of a multi-cylinder internal combustion engine can be characterized by additional marker elements providing additional pulses which, in combination with one marker element, can characterize a certain number representative, for example, of a cylinder.

14 Claims, 13 Drawing Figures

LOCATING SYSTEM TO DETERMINE THE POSITION OF MOVABLE BODIES WITH RESPECT TO A REFERENCE

The present invention relates to a locating system to determine the position of a movable body with respect to a reference and more particularly to determine the position of a piston of an internal combustion engine with respect to a fixed position of the piston in the cylinder.

BACKGROUND AND PRIOR ART

Internal combustion engines require accurate timing of an ignition or fuel injection event with respect to piston position, in order to obtain maximum operating efficiency and output power with a given quantity of fuel with minimum emission of noxious components. Apparatus to determine the position of the piston in the cylinder of an internal combustion engine is therefore needed in order to determine the optimum ignition instant. This optimum ignition instant presupposes presence of a reference signal with respect to which the ignition instant can be computed in dependence on operating parameters of the engine, or operation parameters thereof, such as temperature, pressure (or, rather, vacuum) in the induction pipe, speed, composition of exhaust gases, and the like.

It has previously been proposed to couple a disk which has a single tooth thereon to the shaft of an internal combustion engine. An inductive transducer is in inductively coupled relationship to the tooth on the disk, to provide an output signal when the tooth passes the inductive transducer. A further disk, or sequence of teeth on the same disk, can be provided which induce in the transducer additional output signals to supply data from which the optimum ignition instant can be computed.

It has been found that providing a disk having a plurality of teeth within a predetermined range, coupled to the drive shaft on an internal combustion engine, causes difficulties. Such a disk must be made with extreme accuracy; manufacture thereof, particularly when it is intended to be used with multi-cylinder internal combustion engines is expensive and time-consuming.

THE INVENTION

It is an object to provide a pulse source which is simple in construction and which provides an output signal, in time, exactly representative of the position of a movable element such as a piston within a cylinder. Additionally, recognition of the position of a specific piston of a multi-cylinder internal combustion engine should be simple.

Briefly, the marker elements are arranged in pairs which have respectively different characteristics, for example as magnetic elements one of which presents a North pole and the other a South pole to the transducer. The output signals are applied to threshold stages, the outputs of which are then logically combined to provide an eventual output signal which will be accurately representative of the distance between the marker elements and thus of the distance of travel of the movable body, for example the piston of an internal combustion engine, to which the marker elements are coupled. The marker elements can easily be placed on a movable disk. To recognize different cylinders of a multi-cylinder combustion engine, more than two marker elements can be used in association with any one specific cylinder, the additional marker elements providing a count signal characteristic of the specific piston.

Constructing the marker elements as permanent magnet buttons located on a disk, in which the buttons of a pair have different polarity at the side facing the transducer, results in a simple, reliable and sturdy structure.

If the system in accordance with the present invention is applied to multi-cylinder internal combustion engines, for example four, six or eight-cylinder engines, additional information must be presented characteristic of the firing sequence of the cylinders. This can easily be obtained by providing several pairs of marker elements, for example one for each cylinder, and adding at least one further marker element between the marker elements positioned to characterize a specific cylinder.

The invention will be described by way of example with reference to the accompanying drawings, wherein.

Figure 10:
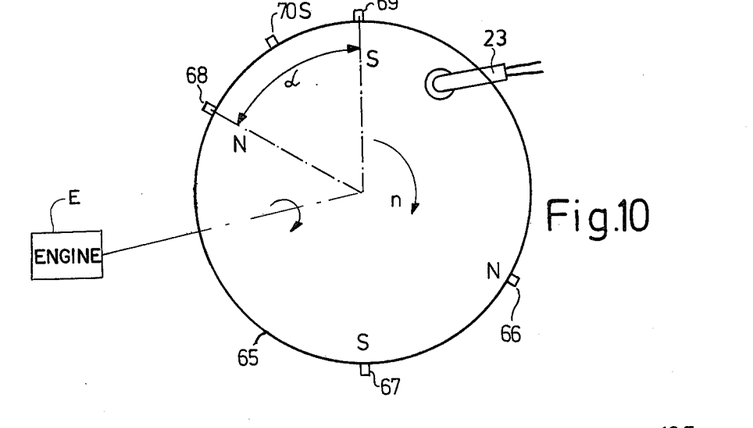
FIG. 10 illustrates a disk having two pairs of marker elements, as well as a third marker element.

The additional marker element shown, for example, in FIG. 10, can be used, preferably, to characterize the upper dead-center (UDC) position of a piston in the cylinder. The firing sequence can then be determined based on the pulse derived from that additional element.

DESCRIPTION OF PREFERRED EMBODIMENT

Figure 1:
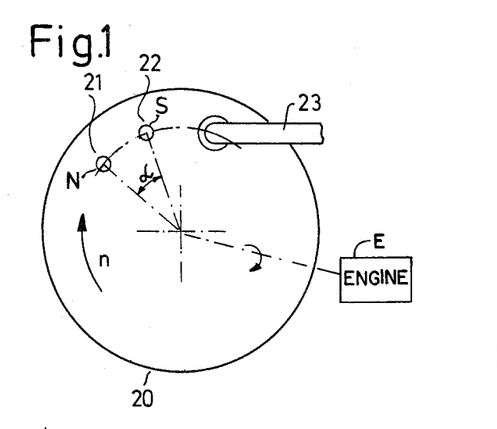
FIG. 1 is a schematic front view of a disk having a pair of marker elements.
Figure 2:
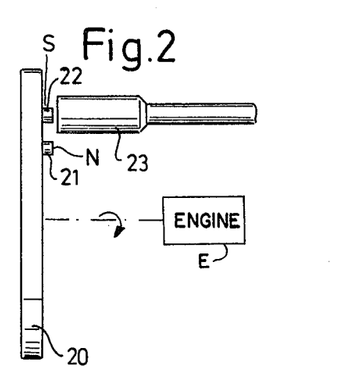
FIG. 2 is a schematic side view of the disk of FIG. 1 and illustrating a transducer in combination therewith.
Figure 3:
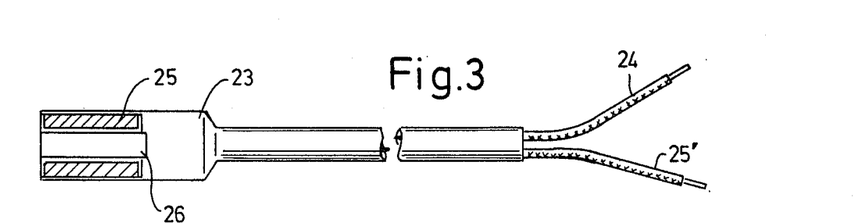
FIG. 3 is a schematic illustration, partly in section, of a transducer.

A disk 20 (FIG. 1) has two marker elements 21, 22 located thereon, placed equidistantly from the center of disk 20. These marker elements are permanent magnet material buttons, located parallel to the axis of the disk and arranged to have different direction of magnetization. For example, marker element 21 has the magnetic North at the outside, whereas marker element 22 has the magnetic South at the outside. The arrangement in which the marker elements are parallel to the axis can be used in combination with teeth at the circumference of the axis, for example to provide a sequence of pulses representative of speed of rotation of the disk 20. Disk 20 is coupled to the body, the movement of which is to be recognized, for example to the crankshaft of the internal combustion engine E. A transducer 23 (FIGS. 2, 3) is located to be in inductive relation with respect to the marker elements 21, 22. The transducer 23 (FIG. 3) has a coil 25 surrounding a ferrite core 26. Cable connections 24, 25' are connected to the terminals of the coil 25 to provide output signals therefrom.

Figure 4:
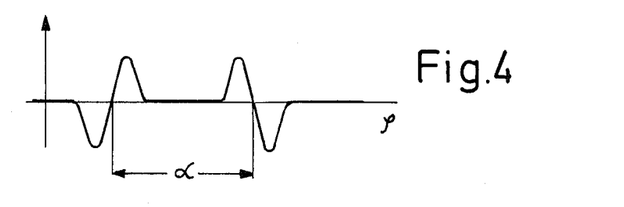
FIG. 4 is a schematic representation of the output signal derived from the transducer of FIG. 3, applied to the disk of FIGS. 1 or 2.

The voltage induced in coil 25 upon rotation of disk 20 immediately adjacent the fixed transducer 23 (the fixed location of which provides a reference) is shown in FIG. 4. It is to be noted that the induced signal has a sequence of half waves which first go negative and then positive on the first half wave, and first positive and then negative on the second half wave. The time between the null position of the two waves is proportional to the angular distance α between the marker elements 21, 22. The steepness of the flanks of the waves induced by the respective marker elements, as well as the amplitude level, depend on the speed of rotation of the disk 20, the construction and sensitivity of the transducer 23, as well as the magnetic strength of the marker elements. Steep flanks are desirable to provide non-ambiguous output signals. Regardless of the steepness of the flanks or the amplitude level, however, the null passage of the signals accurately defines the distance between the marker elements at any given speed of the disk 20, and also the instant of time at which the respective marker elements are in front of the transducer and, hence, the duration of passage of the movable body from a first position with respect to the fixed reference 23 to a second position.

Figure 5:
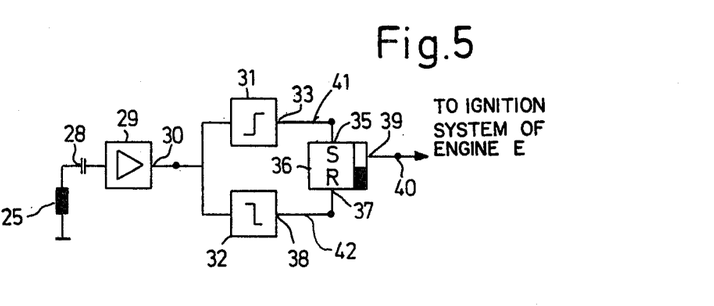
FIG. 5 is a highly schematic block diagram of a wave-shaping and recognition stage.

The signals derived from transducer 23 are evaluated in a circuit as shown, for example, in FIG. 5. The output signal to be derived should be a d-c signal having a time duration which accurately corresponds to the time between passage of the first marker element 21 and the second marker element 22 in front of the fixed transducer 23. The evaluation circuit has a capacitor 28 connected to the coil 25 of the transducer 23; the capacitor is connected to an amplifier 29, the output of which is connected to two threshold circuits 31, 32. The threshold circuits respond to different flanks of the signals derived from FIG. 4; threshold circuit 31 responds to a positive-going flank; threshold circuit 32 responds to a negative-going flank. The outputs 33, 38 of the threshold circuits 31, 32 are connected, respectively, over connecting lines 41, 42 to the set input 35 and the reset input 37 of a set-reset (RS) flip-flop (FF) 36. The direct output 39 of the FF 36 forms the output terminal 40 of the wave-shaping stage.

Figure 6:
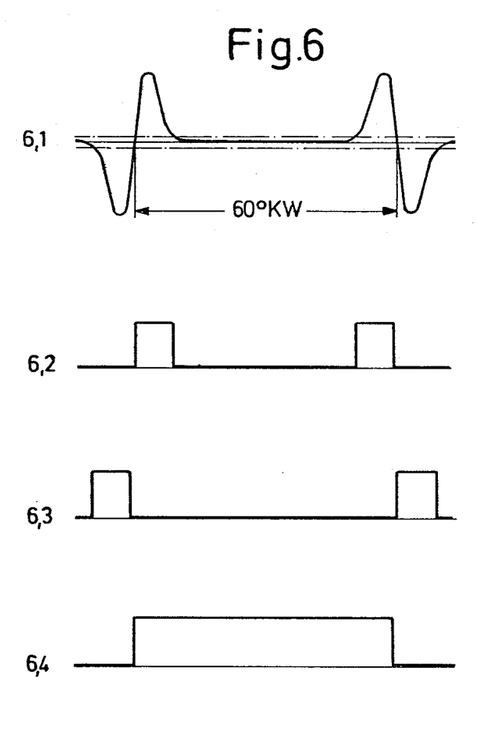
FIG. 6, in lines 6.1 to 6.4, is a sequence of diagrams to illustrate the operation of the circuit of FIG. 5.

Operation (with reference to FIG. 6): Line 6.1 of FIG. 6 shows a signal which corresponds essentially to the signal illustrated in FIG. 4, as it appears at output 30 of amplifier 29 of FIG. 5. The output signal generated by the threshold stage 31 is illustrated in line 6.2; the output signal generated by threshold stage 32 is illustrated in line 6.3. These signals, available at terminal 33, 38 respectively, are derived from the respective positive-going and negative-going waves. The distance between the null of the waves corresponds to a certain angle of the crankshaft of an internal combustion engine, for example a 60°, and indicated as 60° KW. The connection of the RS FF 36 to the terminals 33, 38 of the two threshold stages 31, 32 provides an output at the direct output terminal 39 which is illustrated in line 6.4 of FIG. 6. If the threshold levels of the threshold switches are set to be low, for example as indicated in the chain-dotted lines of line 6.1 of FIG. 6, the length of the signal illustrated in line 6.4 corresponds accurately to the distance between which the waves pass through the null or zero line, as shown in line 6.1.

Figures 7, 8:
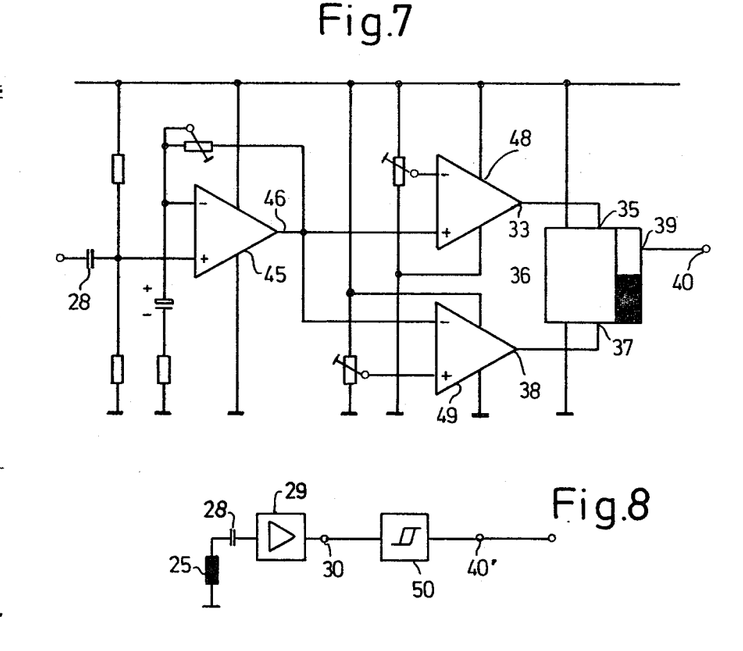
FIG. 7 is a schematic block diagram for the wave-shaping stage of FIG. 5.
FIG. 8 is another example of a wave-shaping stage having a circuit component providing for hysteresis.

The wave-shaping stage of FIG. 5 is shown in detail in FIG. 7. Capacitor 28 is coupled to an a-c amplifier 45, which may be an operational amplifier, the output 46 of which is connected to the direct input of a second operational amplifier 48. Amplifier 48 may also be a limiting amplifier to provide a constant voltage output in order to provide better noise or spurious signal suppression. The output signal of amplifier 45 is additionally connected to the inverting input of a second operational amplifier 49. The outputs of amplifier 48, 49 correspond to the output terminals 33, 38 of FIG. 5 and are connected in like manner to the RS FF 36. The inverting input of amplifier 48 as well as the direct input of amplifier 49 are connected to suitable reference voltages; likewise, the inverting input of amplifier 45 is connected to a suitable, preferably regulated reference voltage. This reference voltage may be obtained, as shown, by a separate reference source or, for example, by the series connection of a Zener diode and a resistor.

A wave-shaping stage with hysteresis characteristic is shown in FIG. 8. The output 30 of amplifier 29 is connected to a circuit 50 which reacts to the first null-passage of the waves and then again to a second null-passage. The output signal of the circuit of FIG. 8 will be directly representative of the signal shown in line 6.4 of FIG. 6; the output signal at terminal 40' is, therefore, identical to that available for terminal 40, FIG. 7. The detailed circuit of the generally illustrated circuit of FIG. 8 is shown in FIG. 8, in which an inverting amplifier 51 with negative feedback is connected to a second inverting amplifier 52 with positive feedback. This circuit corresponds to a Schmitt-trigger.

Figure 9:
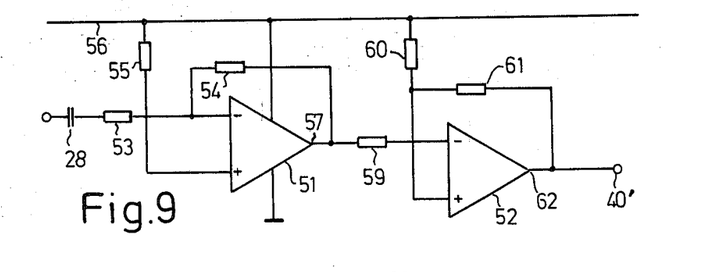
FIG. 9 is a schematic circuit diagram for use in combination with the circuit of FIG. 8.

Capacitor 28 is connected over a resistor 53 with the inverting input of amplifier 51. A negative feedback resistor 54 is coupled from the output 57 to the inverting input. The direct input is connected to a fixed voltage, as shown by connecting the direct input over resistor 55 with a positive bus 56. The output 57 of amplifier 51 is connected through a resistor 59 to the inverting input of the second amplifier 52 which, like the first, is preferably an operational amplifier. The direct input of amplifier 52 is connected over resistor 60 with positive bus 56 and, additionally, over resistor 61 with the output 62. The output 62 of amplifier 52 also corresponds to the output terminal 40'.

Operation of circuits of FIGS. 8 and 9: If the voltage signal at the inverting input of operational amplifier 51 is positive, the output voltage will drop. The subsequent inverting amplifier 52 then provides a voltage rise at the output 62 thereof, which, due to the positive feedback on resistor 61, is additionally amplified. Due to the amplification, the positive voltage at output 62 will remain and will drop only when the inverting input has a positive signal applied thereto. This positive signal at the inverting input is derived by a negative voltage at the inverting input of the first amplifier 51. The hysteresis is adjusted by suitable selection of the resistors 60, 61. The dimensioning of the hysteresis depends on the minimum speed at which the position of the rotating disk 20 is to be recognized, since the voltage derived from the transducer element 23 depends on speed, as well as length of air gap, diameter of the disk, and the magnetic properties of the magnetic buttons 21, 22 and the properties of the magnetic circuit.

If more pulses as shown in line 6.4 of FIG. 6 are required for any one revolution of the crankshaft, and hence of disk 20, then more pairs of marker elements are needed. A recognition characteristic to distinguish the pairs of marker elements is needed, however, and in order to distinguish a specific pair from the other pairs, an additional marker element is used between the specific one to be recognized. A disk having such a plurality of pairs of marker groups, with an additional element, is shown in FIG. 10. Two marker pairs 66, 67 and 68, 69 are located on disk 65. An additional marker element 70 is located between the pairs of elements 68, 69. Two of the three marker elements of the groups 68, 69, 70 will have the same magnetization direction. A recognition circuit is provided which recognizes and distinguishes between directions of magnetization which, sequentially, are the same, or are different, and provides a corresponding output signal. The same transducer 23 used in connection with the disk 20 can also be used in connection with disk 65, FIG. 10.

Figure 11:
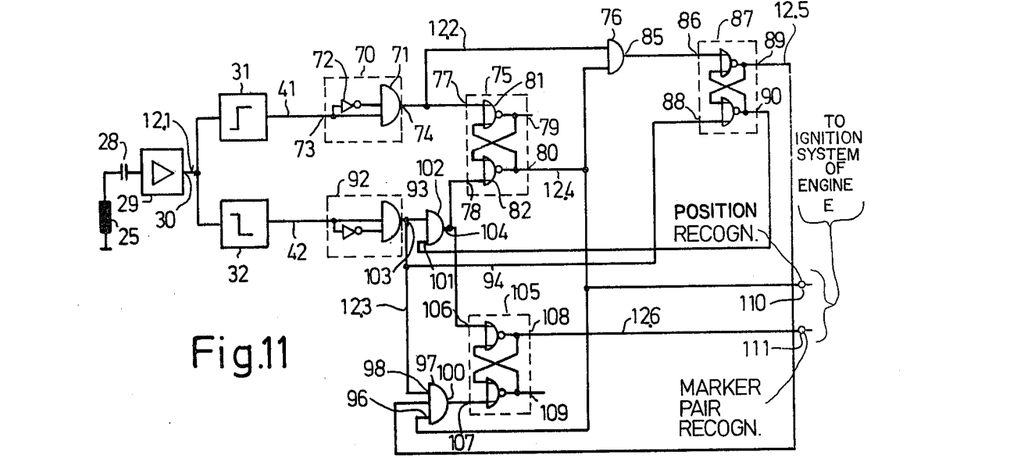
FIG. 11 is a circuit diagram illustrating evaluation of the pulses derived from the disk of FIG. 10.

The wave-shaping stage providing for recognition of marker pairs which have, or do not have, an additional recognizing or characterizing marker (FIG. 10), is shown in FIG. 11. The additional marker element 70 causes an additional pulse. Coil 25 of transducer 23 is coupled over capacitor 28 with the input of the amplifier stage 29, the output 30 of which is coupled to the inputs of the two threshold stages 31, 32. Each of the threshold stages 31 is connected by the lines 41, 42, respectively, to a respective differentiator 70, 92. Differentiator 70 includes an AND-gate 71 and an inverter 72. The input 73 of differentiator 70 is coupled both to the AND-gate 71 as well as to the inverter 72, the output of which is coupled to the second input of the AND-gate 71. The output of AND-gate 71 is at the same time the output 74 of differentiator 70. Such a differentiator has the characteristic that it provides an output signal only upon a rising flank, the duration of which is determined by the response time of the inverter 72. Such a differentiator, therefore, can be used as a recognition circuit for rising flanks. The output 74 is connected to an FF 75 formed of NOR-gates 81, 82, and additionally to one input of an AND-gate 76. FF 75 has two inputs 77, 78 and two outputs 79, 80 which are complementary. FF 75 has as a characteristic that the respective coupling between the NOR-gates 81, 82 is so selected that the output of NOR-gate 81 is connected with one input of the NOR-gate 82 and, similarly, the output of the NOR-gate 82 is connected with an input of the NOR-gate 81. The remaining input of each of the two NOR-gates 81, 82 is connected to the respective inputs 77, 78. The outputs of the NOR-gates 81, 82 are connected to the respective outputs 79, 80 of the FF 75. The output 80 of FF 75 is coupled to the second input of AND-gate 76; the output 85 of AND-gate 76 is connected to the input 86 of a further FF 87.

The output of the second threshold stage 32, namely line 42, is connected to the second differentiator 92. Differentiator 92 is identical to differentiator 70. The output of differentiator 92 is available at a junction 93, from which a line 94 is connected to a second input 88 of FF 87. The output 89 of FF 87 is connected to one input of an AND-gate 97. The output 90 of FF 87 is connected to the input 101 of AND-gate 102. The second input 103 of AND-gate 102 is connected to junction 93. The output 104 of AND-gate 102 is connected to the input 78 of FF 75. The junction 93 is additionally connected to the input 98 of AND-gate 97. The output 80 of the FF 75 is connected not only to the second input of AND-gate 85 but also to the third input 96 of AND-gate 100, and additionally forms one output terminal 110 of the circuit. A further FF 105 has an input 106 connected to the output 104 of AND-gate 102, an input 107 connected to the output 100 of the AND-gate 97 and an output 108 connected to the output directly to the output 111 of the stage, forming the recognition signal output.

The three FF's 75, 87, 105 may be similar; the outputs 79 of FF 75 and 109 of FF 105 are not needed, and may be left blank.

Figure 12:
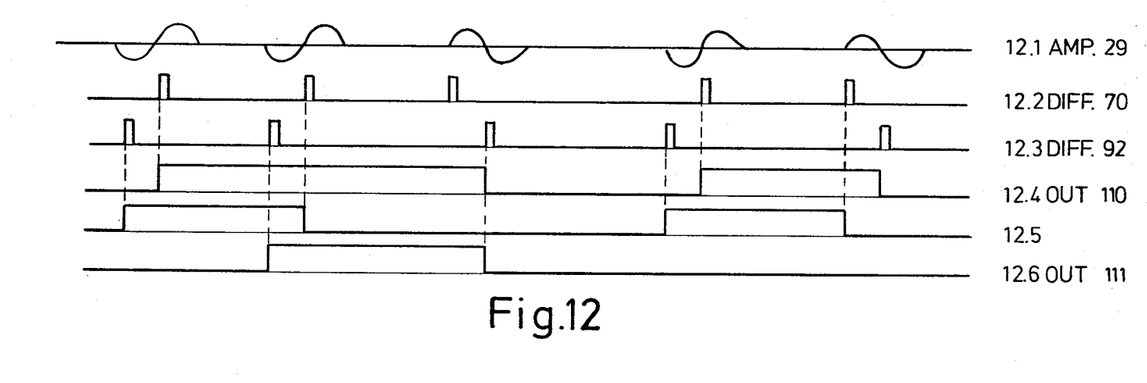
FIG. 12 is a pulse diagram illustrating the pulses derived from the disk of FIG. 10.

Operation, with reference to FIG. 12: The pulse diagramm in line 12.1 illustrates the output signal derived from amplifier stage 29 to a much smaller scale than FIG. 6, line 6.1. The signals corresponding to lines 6.2 and 6.3 are not shown. Rather, lines 12.2 and 12.3 show the output signals derived from differentiators 70, and 92, respectively. The pulses illustrated on line 12.2 and 12.3 occur at the beginning of the respective flank, starting from the zero or null line. The pulse width depends on the response time of the respective inverter in the differentiator 70, 92. Line 12.4 illustrates the output signal at terminal 80 of FF 75 which is also the output signal at terminal 110 of the circuit, and which corresponds, in length, to the distance between a pair of marker elements associated together and having respective alternating characteristics. The third marker element is provided to recognize a respective pair of markers, and the output signal is illustrated in line 12.6.

Figure 13:
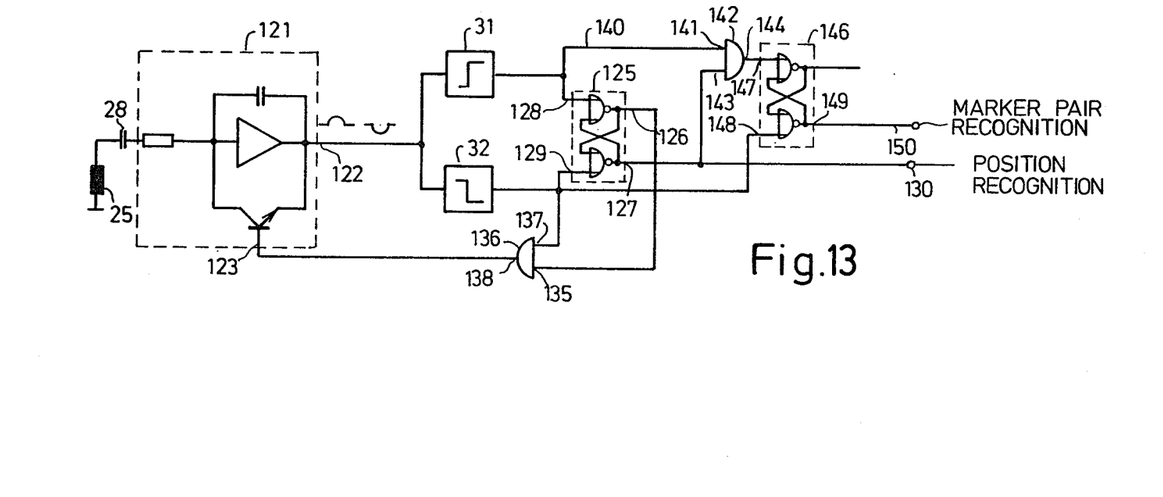
FIG. 13 is a further circuit diagram to evaluate pulses generated by the disk of FIG. 10.

FIG. 13 illustrates another example of wave-shaping and wave recognition. Coil 25 of transducer 23 is connected to capacitor 28 which is connected to a subsequent integrating stage 121. Integrating stage 121 has an output terminal 122 and a reset terminal 123. The two threshold stages 31, 32 are connected to output 122. A first FF 125 has its respective inputs 128, 129 connected to the outputs of the threshold switches 31, 32. The outputs 126, 127 of the FF 125 are connected, respectively, to an input 135 of an AND-gate 136 and to an input 143 of an AND-gate 142, the second input 141 of which is connected over line 140 also to the output of threshold stage 31. The second input 137 of AND-gate 136 is connected to the output of threshold stage 32. The output 138 of AND-gate 136 is coupled to the reset input 123 of integrator 121.

Output 144 of AND-gate 142 is connected to input 147 of a further FF 146. A second input 148 is connected to the output of the threshold stage 32. The output 149 of FF 146 is connected to the recognition terminal 150 on which the respective recognition signals, based on recognizing the additional marker elements 70 on disk 65, is available.

The basic principle of the circuit of FIG. 13 concerns integration of the signals derived from coil 25. Due to the capacitative coupling of the signals, they will have the same area (on a time scale graph) and thus the output signal of the integrator will correspond, in its polarity with respect to the first present signal, to the pulse triggered by the marker element. The subsequent threshold stages 31, 32 provide a pulse to the subsequent FF 125 in accordance with their response threshold levels and effect corresponding setting and resetting. Since a pair of marker elements has a corresponding output signal from threshold switches 31, 32, output 130 will have a signal appear thereat having a time duration characterizing a pair of alternate marker elements. The first marker element of one polarity will set FF 125; a subsequent signal applied to FF 125 of the same polarity will have no effect. The next signal of oppositve polarity will reset FF 125. If threshold stage 31, therefore, provides two subsequent signals of the same polarity, FF 146 will respond to provide a recognition output at terminal 149, and hence on line 150. Integrater 121 is reset upon simultaneous occurrence of a signal at output 126 of FF 125 and a signal at the output of threshold stage 32. This circuit avoids problems of drift of the integrator if the input voltages deviate from null.

The present invention provides a circuit which is simple, thus inexpensive and reliable. The recognition is based on recognizing differences in characteristics of the transducing elements, that is, differences in direction of magnetization of the permanent magnet elements 21, 22 or 66, 67; 68, 69, respectively. The wave-shaping and recognition stages connected to the transducer system formed by the combination of the marker elements and the transducer 23 are used to recognize the respective marker elements and to process the pulses triggered by the respective marker elements. Various instants of time corresponding to certain angular positions of the crankshaft can be fixed, depending on the size of the disk, and the size of the magnets placed thereon. For example, the intervals to trigger ignition instants can be determined, as well as a signal which is derived when, for example, a specific one of the pistons of the internal combustion engine is at exactly UDC position. This signal may be derived, for example, from the third marker 70.

Other marker elements than permanent magnets may be used; for example, an optical system can be used in which, instead of differential polarity of magnetization, differential characteristics of light are evaluated, such as differential polarization for example.

The present invention is particularly useful in combination with internal combustion engines. Each pair of marker elements may, for example, be so spaced that it has a predetermined relationship to possible ranges of ignition advance or retardation with respect to at least one specific cylinder of the internal combustion engine.

FF 125 (FIG. 13) corresponds, essentially, to the FF 36 of FIG. 5; the circuit including AND-gate 142 and FF 146 then adds a counting stage, counting to two, and being reset in each case by the pulse of alternate polarity derived from threshold stage 32, in order to recognize more than one sequential pulse of the same polarity.

The embodiment of the invention described in connection with FIGS. 11 and 12 is not required to analyze the angular distance between the markers having opposite polarity as such; rather, a signal is derived which has a pulse duration proportional to the angular segment from the logic circuit which analyzes the difference in initial polarity of the halfwaves of the first one of markers of a different polarity, thus, referring to FIG. 12, of the first and third wave; the second wave is not analyzed since it has the same polarity distribution as the first, as far as the angular distance output is concerned — see wave on line 12.4. An output at line 12.6 is obtained if and only if there is a sequence of more than one wave having the same polarity distribution, in time. The additional marker is present only to determine that a particular element, in an internal combustion engine a particular piston is being analyzed. This is of importance in connection with non-symetrical, multicylinder engines, since symetrical relationships regarding initiation time of ignition, for example to initiate a count to accurately determine an ignition angle, is absent.

The angular intervals between a pair of markers can be considered to be possible angular positions to trigger an ignition event. It would then appear that, theoretically, a pair of markers is required for each cylinder. If the cylinder arrangement is symetrical, and the number of cylinders is even, half the number of marker pairs only are needed. If the measuring disk carrying the markers elements, e.g. disk 20 (FIG. 1) is coupled to the crankshaft of the engine than, in a four cycle engine, two revolutions of the crankshaft are necessary until the same position of the piston in the cylinder reoccurs. Thus, for example, two revolutions are necessary until another ignition spark is required. It is, however, equally possible to cause an ignition spark at each rotation of the crankshaft. One of the ignition sparks will be superfluous, and will occur at the end of the exhaust stroke. This ignition spark at the sparkplug of the engine has no effect since the exhaust valves are still open at that instant of time, and there is no longer any combustible mixture in the cylinder. Thus, a four cylinder internal combustion engine can be operated with two marker pairs, and if it is desired to specifically determine one of the pistons, with a disk, for example, such as disk 65 of FIG. 10.

Various changes and modifications may be made within the scope of the inventive concept.

We claim:

1. Locating system to determine the position of a movable body (20, 65) comprising
at least four marker elements (21, 22; 66, 67; 68, 69) coupled to move with the body, a stationary transducer means (23) responsive to the marker elements and providing output signals staggered in time as the marker elements pass by the transducer means, the marker elements, in combination with the transducer means, forming a wave signal source;
wherein two marker elements (21, 22; 66, 67; 68, 69) each have different characteristics from the other two and the four elements are sequentially arranged on the body in pairs, with the elements of each pair being spaced by a predetermined distance to define a predetermined distance range on the body, and with the elements of each pair having respectively different characteristics;
the transducer means (23), upon scanning individual marker elements of the pairs (21 and 22; 66 and 67; 68 and 69) providing wave signals of respectively different initial polarity;
means (70) to distinguish between specific pairs of marker elements on the body, said distinguishing means comprising an additional marker element (70) located between the marker elements of at least one of the pairs (68, 69) and having the characteristic of one of the markers thereof;
and logic means (70, 92, 75; 87, 105, 76) connected to the transducer means and having two output terminals (110,111), said logic means (a) providing a first output pulse (12.6) at a first output terminal representative of the time between the null passage of sequential wave signals of opposite initial polarity and (b) a second output pulse (12.4) at the second output terminal (110) indicative of the occurrence of two sequential wave signals of like initial polarity,
whereby presence of an output pulse at said second output terminal (110) will be indicative of said additional marker element (70) between a pair of marker elements of unlike characteristic.

2. Locating system according to claim 1, wherein said logic means includes at least one polarity recognition stage (70, 92), and a counter stage (75) connected to at least said one polarity recognition stage and providing an output when said at least one polarity stage senses sequential occurrence of two wave signals of like initial polarity.

3. System according to claim 1, in combination with the ignition system for an internal combustion engine, wherein the body comprises a disk rotating in synchronism with rotation of the internal comoustion engine, and wherein the distance between the marker elements of a pair (21, 22; 66, 67; 68, 69) is related to the ignition advance and retardation range of at least one of the cylinders of the internal combustion engine.

4. System according to claim 1 wherein the marker elements (21, 22; 66, 67; 68, 69, 70) comprise magnetic elements and the characteristic thereof as the polarity of the portion of the magnetic elements to which said transducer means (23) is exposed, said transducer means being a magnetically responsive pick-up.

5. System according to claim 1 wherein the marker elements (21, 22; 66, 67; 68, 69, 70) comprise permanent magnetic elements;
the transducer means comprises magnetically responsive pick-up means (23) positioned to be responsive to the magnetic field from said permanent magnet elements;
and wherein the elements of a pair associated with the transducer means have different magnetic polarity, said different polarity forming said respectively different marker characteristics.

6. Locating system to determine the position of a movable body (20, 65) comprising
at least two marker elements (21, 22; 66, 67, 68, 69) coupled to move with the body, and stationary transducer means (23) responsive to the marker elements and providing output signals staggered in time as the marker elements pass by the transducer means, the marker elements, in combination with the transducer means, forming a wave signal source;
wherein said two marker elements (21, 22; 66, 67; 68, 69) have different characteristics and are associated to form a pair, located on the body, spaced by a predetermined distance thereon to define a predetermined distance range on the body (20, 65);
the transducer means, in combination with the individual marker elements of the pair (21 and 22; 66 and 67; 68 and 69) providing respective signal waves of respectively different initial polarity;
and logic means (121, 125, 136) connected to the transducer means (32) to evaluate and logically combine the signals from the transducer means and to provide an output pulse representative of the time between the null passage of the signal waves comprising
an integrator (121) and a pair of threshold stages (31, 32) responsive to the polarity of the integrated outputs of the integrator, the integrator being connected between the output of the transducer means (23) and the input to the threshold stages (31, 32) to provide integrated outputs to the threshold stages of the respective wave signals;
and means (125) connected to the threshold stages and recognizing alternate response of the respective threshold stages and providing said output pulse upon sequential response of alternate threshold stages.

7. System according to claim 6, further comprising a reset circuit (136) connected to the output of the threshold stages (31, 32) and resetting the integrator (121) after recognition of the second marker of a marker pair to inhibit spurious response of the integrator and prevent drift.

8. System according to claim 6, further comprising means (70) to distinguish between specific pairs of marker elements of the body, said distinguishing means comprising an additional marker element (70) located between the marker elements of at least one of the pairs (68, 69) and having the characteristic of one of the markers thereof;
and a polarity recognition means (142, 146) connected to said threshold stages and recognizing sequential response of one of said threshold stages before the other one of the stages has responded and providing an output signal upon recognition of such sequential response.

9. System according to claim 8, wherein said polarity recognition means comprises logic means (142) and a counter (146), said logic means decoding the polarity of response of the threshold stages, response of one of the threshold stages providing a reset input to the counter, the counter providing a count to determine if the other of said stages has responded more than once before being reset by said one stage.

10. System according to claim 6, in combination with the ignition system for an internal combustion engine, wherein the body comprises a disk rotating in synchronism with rotation of the internal combustion engine, and wherein the distance between the marker elements of a pair (21, 22; 66, 67; 68, 69) is related to the ignition advance and retardation range of at least one of the cylinders of the internal combustion engine.

11. System according to claim 6, wherein the marker elements (21, 22; 66, 67; 68, 69, 70) comprise magnetic elements and the characteristic thereof as the polarity of the portion of the magnetic elements to which said transducer means (23) is exposed, said transducer means being a magnetically responsive pick-up.

12. System according to claim 8, wherein the marker elements (21, 22; 66, 67; 68, 69, 70) comprise magnetic elements and the characteristic thereof as the polarity of the portion of the magnetic elements to which said transducer means (23) is exposed, said transducer means being a magnetically responsive pick-up.

13. In an ignition system for an internal combustion engine a locating system to determine the position of a rotating disk body (20, 65) rotating in synchronism with rotation of the internal combustion engine
at least four magnetic marker elements (21, 22; 66, 67; 68, 69) coupled to said disk;
a stationary electromagnetic transducer means (23) responsive to the magnetic field from the magnetic marker elements and providing output signals staggered in time as the marker elements pass by the transducer means (23), the marker elements, in combination with the transducer means, forming a wave signal source;
wherein two marker elements (21, 22; 66, 67; 68, 69) are provided with fields of respectively different polarity from the other two and the four elements are sequentially arranged on the body in pairs, with the elements of each pair being spaced by a predetermined distance to define a predetermined range on the body and with the elements of each pair having respectively different polarity fields;
the transducer means (23), upon scanning individual marker elements of the pairs (21 and 22; 66 and 67;

68 and 69) providing wave signals of respectively different initial polarity;

means (70) to distinguish between specific pairs of said marker elements on the body, said distinguishing means comprising an additional magnetic marker element (70) located between the marker elements of at least one of the pairs and having the field polarity of one of the markers;

and logic means (70, 92, 75; 87, 105, 76) connected to the transducer means and having two output terminals (110, 111), said logic means (a) providing a first output pulse (12.6) at a first output terminal representative of the time between the null passage of sequential wave signals of opposite initial polarity and (b) a second output pulse (12.4) at the second output terminal (110) indicative of the occurrence of two sequential wave signals of like initial polarity, whereby presence of an output pulse at said second output terminal (110) will be indicative of said additional marker element (70) between a pair of marker elements presenting fields of unlike polarity to said transducer means.

14. System according to claim 13 wherein the logic means comprises an integrator (121) and a pair of threshold stages (31, 32) responsive to the polarity of the integrated outputs of the integrator, the integrator being connected between the output of the transducer means (23) and the input to the threshold stages (31, 32) to provide integrated outputs to the threshold stages of the respective wave signals;

and means (125) connected to the threshold stages and recognizing alternate response of the respective threshold stages and providing said output pulse upon sequential response of alternate threshold stages.

* * * * *